United States Patent [19]

Verret et al.

[11] Patent Number: 4,797,372

[45] Date of Patent: Jan. 10, 1989

[54] METHOD OF MAKING A MERGE BIPOLAR AND COMPLEMENTARY METAL OXIDE SEMICONDUCTOR TRANSISTOR DEVICE

[75] Inventors: Douglas P. Verret, Sugarland, Tex.; Michael C. Smayling, Freising, Fed. Rep. of Germany; Abnash C. Sachdeva, Houston; Stephen A. Keller, Sugarland, both of Tex.

[73] Assignee: Texas Instruments Incorporated, Dallas, Tex.

[21] Appl. No.: 922,961

[22] Filed: Oct. 24, 1986

Related U.S. Application Data

[63] Continuation-in-part of Ser. No. 793,881, Nov. 1, 1985, abandoned.

[51] Int. Cl.⁴ .................... H01L 21/22; H01L 21/265
[52] U.S. Cl. ........................ 437/034; 357/34; 357/42; 357/91; 437/31; 437/54; 437/57
[58] Field of Search ............ 437/31, 34, 54, 57; 357/34, 42, 91

[56] References Cited

U.S. PATENT DOCUMENTS

| | | | |
|---|---|---|---|
| 4,403,393 | 9/1983 | Curran | 437/34 |
| 4,443,933 | 4/1984 | de Brebisson | 437/31 |
| 4,445,268 | 5/1984 | Hirao | 437/31 |
| 4,484,388 | 11/1984 | Iwasaki | 437/31 |
| 4,495,010 | 1/1985 | Kranzer | 437/31 |
| 4,502,201 | 3/1985 | Muramatsu | 437/54 |
| 4,512,815 | 4/1985 | Kladder et al. | 437/31 |
| 4,529,456 | 7/1985 | Anzai et al. | 437/57 |
| 4,536,945 | 8/1985 | Gray | 437/34 |

FOREIGN PATENT DOCUMENTS

| | | | |
|---|---|---|---|
| 0110313 | 6/1984 | European Pat. Off. | 27/06 |
| 0151347 | 8/1985 | European Pat. Off. | 21/82 |

OTHER PUBLICATIONS

IBM Technical Disclosure Bulletin, vol. 28, No. 5, Oct. 1984, pp. 3036–3037, New York, U.S.
IEEE Transactions on Electron Devices, vol. ED-32, No. 5, May 1985, pp. 926–931, IEEE, New York, U.S.

Primary Examiner—Upendra Roy
Attorney, Agent, or Firm—Stanton C. Braden; James T. Comfort; Melvin Sharp

[57] ABSTRACT

A method of making a merged bipolar and field effect semiconductor transistors on a semiconductor substrate by forming a diffused buried DUF collector region of a second conductivity type in the substrate, and growing an impurity doped epitaxial layer of silicon of the second conductivity type over the substrate. Once the epitaxial layer is grown, a plurality of isolation regions are formed in this layer. A bipolar transistor is formed over the DUF region in a bipolar isolation region and a field effect transistor formed in the second isolation region. Contacts and interconnects are deposited and patterned.

28 Claims, 8 Drawing Sheets

METHOD OF MAKING A MERGE BIPOLAR AND COMPLEMENTARY METAL OXIDE SEMICONDUCTOR TRANSISTOR DEVICE

This is a continuation-in-part of Ser. No. 793,881, filed Nov. 1, 1985, now abandoned.

BACKGROUND

The present invention relates to a merged bipolar and metal oxide transistor integrated circuit device including a method of fabrication thereof. The method is applicable to incorporating complementary metal oxide transistors together with a bipolar transistor on a semiconductor substrate in a single merged flow.

Semiconductor manufacturers have wanted to combine bipolar and complementary metal oxide semiconductor (CMOS) transistors in integrated circuits in order to obtain the rapid switching ability and high current drive of the bipolar transistor together with the comparatively low energy consumption of the CMOS transistors. However, the general approach has been to manufacture the merged devices serially in order to avoid compromising diffusion profiles which result in poorer performance. But serial processing is lengthy and proliferates the number of masking steps which in turn reduces yield. Moreover, serial processing is susceptible to the problem of later process steps altering the results of earlier process steps.

The alternative to serial processing is merged or parallel processing in which some or all of the steps required to build one device are used simultaneously to build others thereby reducing the number of masking levels and processing steps. Unfortunately, the process recipes used to date do not always produce optimum performance in all structures simultaneously. In some cases a process recipe that optimizes the performance of some of the devices actually prevents other devices from functioning in any useful manner at all.

A process for merging bipolar and MOS transistors is disclosed in U.S. Pat. No. 4,536,945 issued to Gray et al on Aug. 27, 1985 and assigned to National Semiconductor Corporation. In this case a bipolar transistor and a p-channel transistor are formed in an n-type epitaxial layer while an N-channel transistor is formed on a retrograde p-well. Each transistor is isolated by a thick oxide region extending down to the substrate. The Gray device discloses no means for inhibiting "latch up" of its p-channel transistor caused by leakage current flowing to the substrate.

Gray forms a retrograde p-well before formation of the oxide isolation regions used to separate the transistors. This is done by diffusing together a second impurity deposited on the substrate and a third impurity deposited on the epitaxial layer. The latter step is followed by other anneal steps in addition to that for forming the oxide isolation regions. These anneal steps cause upward diffusion of the diffused N-type region at the bottom of the bipolar transistor making the thickness of the epitaxial region uncertain and difficult to control. The latter results make it difficult, in turn, to control the transistor breakdown voltage.

A second problem caused by the foregoing anneal steps is the depletion of boron at the surface caused by leaching or depletion of the boron by silicon oxide. This depletion makes the threshold voltage difficult to control.

The use of an indirect moat by Gray et al. and reliance on the oxide isolation regions to establish moat boundaries results in a lower limit to the spacing between transistors which is achievable (typically of the order of 10 microns). Secondly, due to the charge stored on the oxide-silicon interface a relatively significant leakage normally results along this interface.

Third, use of a long high temperature collector diffusion in Gray creates problems in controlling transistor gain and breakdown voltage. Such prolonged high temperature applications cause all of the diffused areas to change and further deplete the surface concentration of Boron and causes upward diffusion of the N-type layer at the substrate surface. In addition, there is no provision for avoiding the formation of polysilicon filaments folowing etching due to the steep topography created by the 'birdsheads' at the top of the oxide isolation regions. These filaments can cause shorting problems.

It is therefore an object of the invention to provide an improved method of making merged bipolar and MOS devices. In particular it is an object of this invention to provide a method of making an improved merged bipolar and CMOS device.

SUMMARY OF THE INVENTION

According to the invention there is provided a method of making a merged bipolar and metal oxide semiconductor (MOS) transistor on a semiconductor substrate by forming a diffused buried DUF collector region of a second conductivity type in the substrate, and growing an impurity doped epitaxial layer of silicon of the second conductivity type over the substrate. Once the epitaxial layer is grown, a plurality of isolation regions are formed in this layer. A bipolar transistor is formed over the DUF region in a bipolar isolation region and a metal oxide transistor formed in a MOS isolation region.

Implanting and diffusing of the source and drain of the field effect transistor is done concurrently with implanting and diffusing of the bipolar transistor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

DETAILED DESCRIPTION WITH REFERENCE TO THE DRAWINGS

Figure 1:
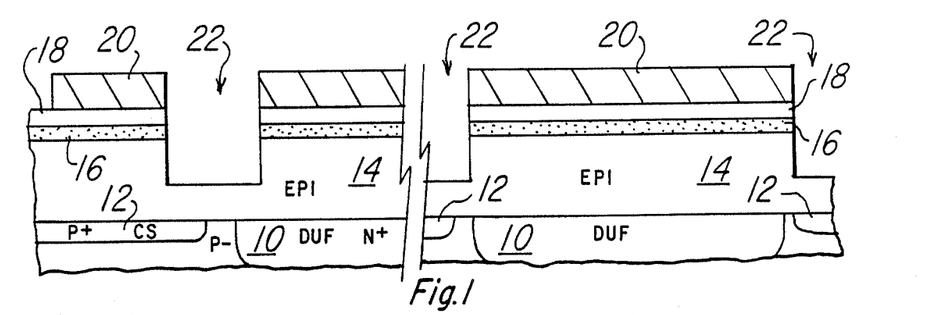
FIG. 1-18 are greatly enlarged elevation views in section of a small portion of a semiconductor chip showing the process steps in fabricating a merged bipolar and CMOS device.

Referring to FIG. 1 there is shown the stage of formation of oxide isolation in an N-type epitaxial layer 14 which has been grown over a pair of N+ buried DUF regions 10 doped with arsenic so as to have a sheet resistance of 15 ohms per square formed in the p-type substrate of a silicon slice (not shown). Also formed in the substrate before growing the N-type epitaxial layer 14 are P+ channel stop regions 12. A thin oxide layer 16 of about 800–1600 Angstroms is grown over the epitaxial layer and then a layer of silicon nitride 18 of about 800-1200 Angstroms thick is formed over the entire slice. A coating of photoresist 20 is applied to the entire top surface of the slice and then exposed to ultra violet light through a mask which defines the desired pattern of spaced apart recessed areas 22. The photoresist is then developed leaving open areas where nitride, oxide and silicon are then removed by etching to form recessed oxide isolation regions 22. The recessed regions are formed over the top end of underlying channel stop regions 12.

Figure 2:
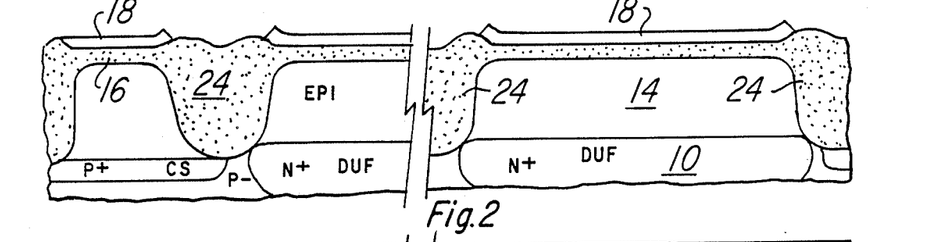
Figure 3:
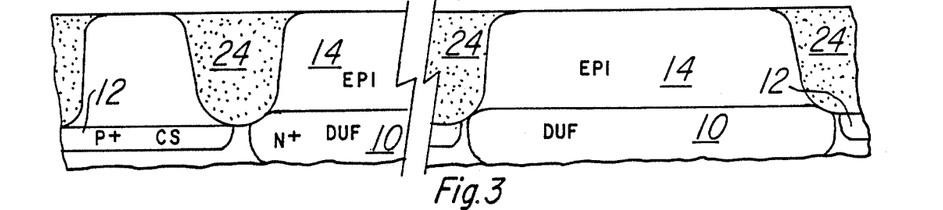

The photoresist 20 is then stripped and the entire slice exposed to an oxidizing high pressure atmosphere at about 900° C. for about 2 hours. During oxidation silicon is consumed so that a relatively thick oxide isolation region is formed part of which is above the bottom of recessed region 22 of FIG. 1 and part below as seen best in FIG. 2. The top surface of the oxide isolation regions 24 develop bumps commonly referred to as 'birdsheads'. The remaining silicon nitride 18 is removed by etching and a layer of photoresist (not shown) with the same etch rate as oxide 24 is applied to the top surface using a "spin on" technique so that the top surface of the photoresist is substantially flat. Next the photoresist is etched back by a reactive ion etch technique until the 'birdsheads' and oxide layer 16 are a flat top surface as seen in FIG. 3.

Figure 4:
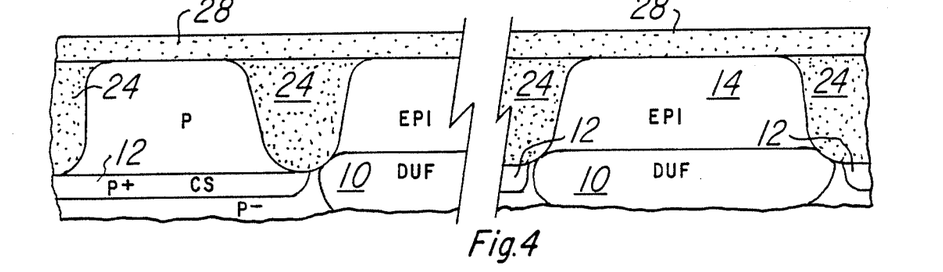

A thermal oxide layer 28 is grown by placing the slice in an oxidizing atmosphere at atmosphere pressure for a sufficient time until a thickness of about 0.25 microns is grown as seen in FIG. 4.

Figure 5:
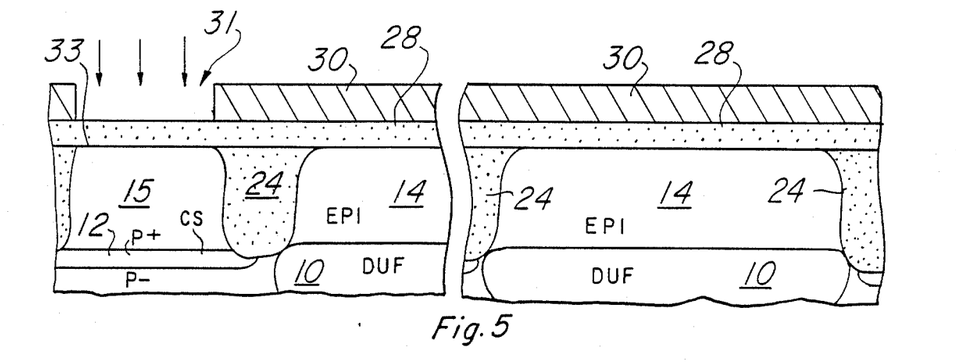

Photoresist 30 is once again deposited over the entire surface of the slice at a thickness sufficient to block a high energy implant and patterned to open region 31 adjacent the oxide isolation region 24 as seen in FIG. 5. Boron or another group III impurity is implanted through the oxide layer 28 with a peak concentration at the epitaxial surface 33 at an energy in the range of 60-110 KeV with a preferred value of 90 KeV and a dose of about $1.0 \times 10^{12}$ atoms per square centimeter. The foregoing shallow boron implant is preceded by an implant having a peak concentration midway from the surface 33 to the channel stop region 12 at over 200 KeV or preferably 240 KeV and a dose of $3-7 \times 10^{12}$ atoms per square centimeter. The thickness of the photoresist 30 is sufficient to block the implantation in regions other than through opening 31. The volume below opening 31 is referred to as a P-well 15.

Figure 6:
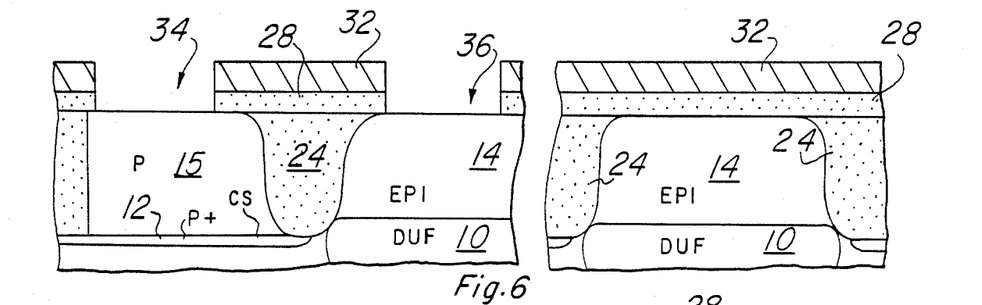
Figure 7:
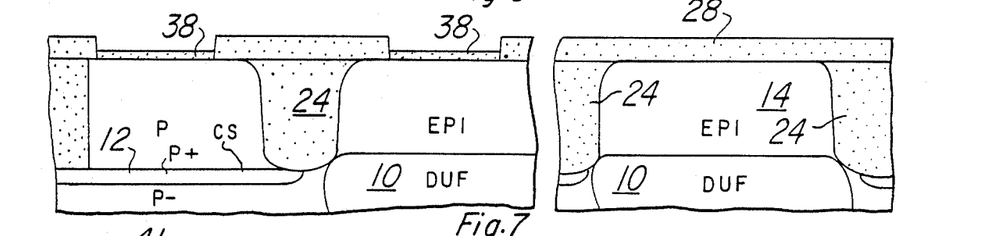
Figure 8:
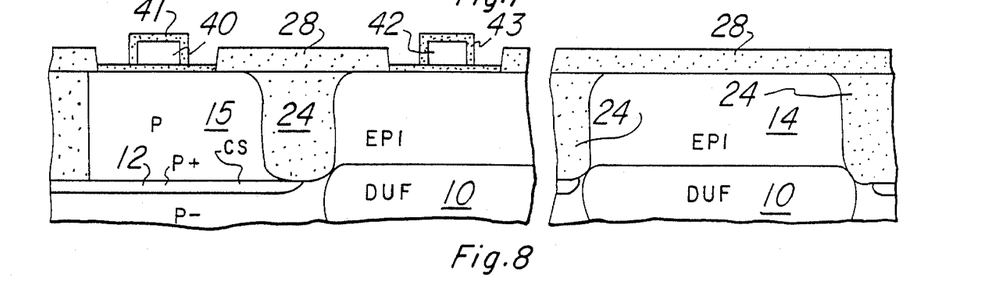
Figure 9:
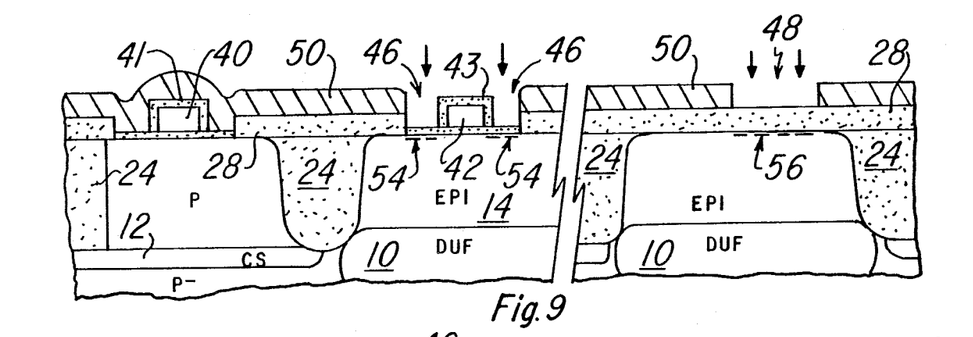
Figure 10:
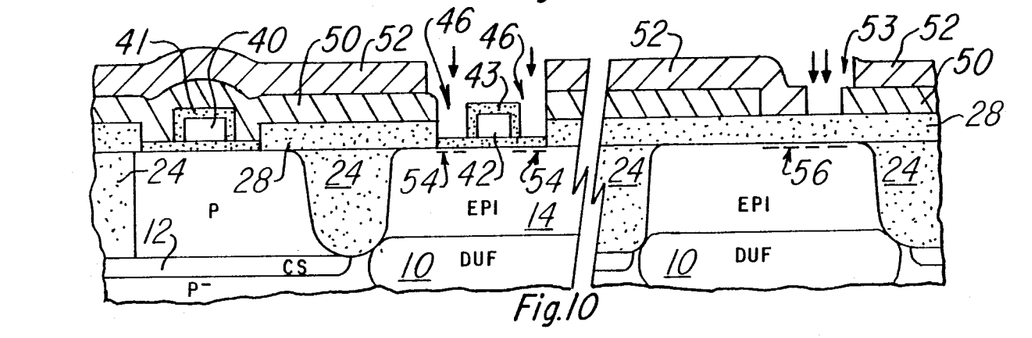

Photoresist layer 30 is stripped and a new photoresist layer 32 is laid down and patterned so as to provide openings 34 and 36 as seen in FIG. 6 where metal oxide semiconductor (MOS) moats are to be formed. Following development of the photoresist 32 portions of oxide 28 within openings 34 and 36 are removed by etching and then gate oxide layers 38 approximately 200-500 Angstroms thick are grown as seen in FIG. 7. A polysilicon layer is then deposited over the slice to a thickness of approximately 6,000 angstroms and doped n-type by means of phosphorus oxychloride (POCl$_3$) in a high temperature furnace. The doped polysilicon is then patterned and etched so as to leave gates 40 and 42. Thermal oxide layers 41 and 43 are grown on the polysilicon gates 40 and 42, respectively, as seen in FIG. 8 to a thickness of about 0.1 to 0.2 microns. Another photoresist layer 50 is deposited and patterned so as to open regions 46 to be source and drain of a P-channel field effect transistor and region 48 to become a base and emitter region of a bipolar transistor as seen in FIG. 9. An implant of boron is done at 90 KeV to a total dose of about $1-7 \times 10^{13}$ atoms per square centimeter through oxide layer 28. A new photoresist layer 52 is laid down and patterned to leave open regions 46 again as well as a smaller opening 53 over a portion of the boron implant 56 as seen in FIG. 10. Another boron implant is done at 70-110 KeV or more preferably 90 KeV to a dose of about $5-9 \times 10^{14}$ atoms per square centimeter. Photoresist layers 50 and 52 are then stripped.

Figure 11:
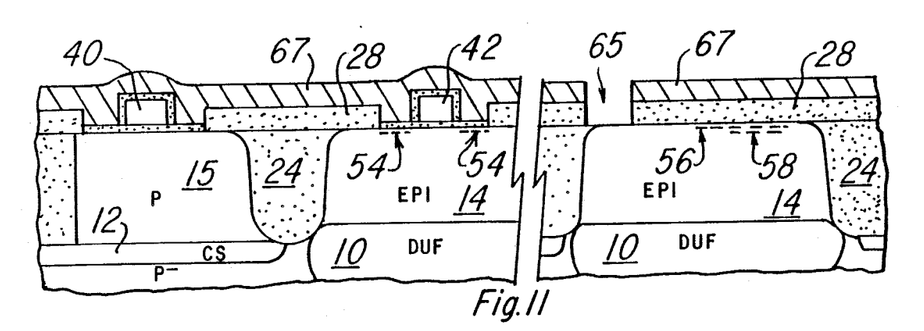
Figure 12:
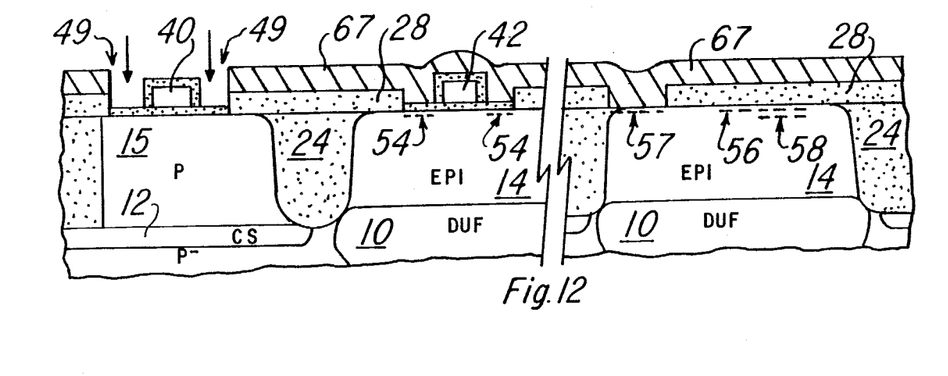
Figure 13:
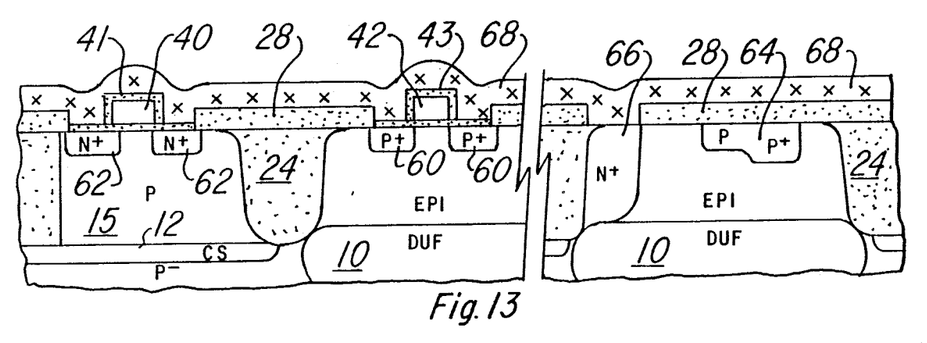

Another photoresist layer 67 is deposited and patterned to open contact 65 as seen in FIG. 11. The oxide is removed in the open region 65 and a phosphorous N-type implant is made at 90-150 or more preferably at 100 KeV to a dose of about $2-6 \times 10^{16}$ atoms per square centimeter or more preferably $2.5 \times 10^{16}$ atoms per square centimeter. Phosphorous, being relatively small in size, penetrates deeply into the epitaxial layer 14 for this implantation energy. Photoresist layer 67 is removed. Next, another photoresist layer 60 is deposited and patterned as shown in FIG. 12 to leave openings 49 for the N-channel MOS transistor source and drain. An arsenic implant is done at 90-150 or more preferably 120 KeV to a dose of about $2-10 \times 10^{15}$ or more preferably $4 \times 10^{15}$ atoms per square centimeter. The photoresist 60 is stripped and a deposition of phosphosilicate glass (PSG) 68 is made followed by a high temperature anneal in an inert atmosphere so as to activate the latter implants as well as implants 54, 56 and 58 and to cause the PSG to flow as seen in FIG. 13. During the anneal step diffused regions 62, 60, 66 and 64 are formed corresponding to the sources and drains of the N-channel and P-channel transistors, the bipolar collector and the bipolar base, respectively. Because of the deepness of the collector implant 66 it diffuses both upwardly and downwardly to both the buried collector or DUF 10 and to the surface of the epitaxial layer 14.

Figure 14:
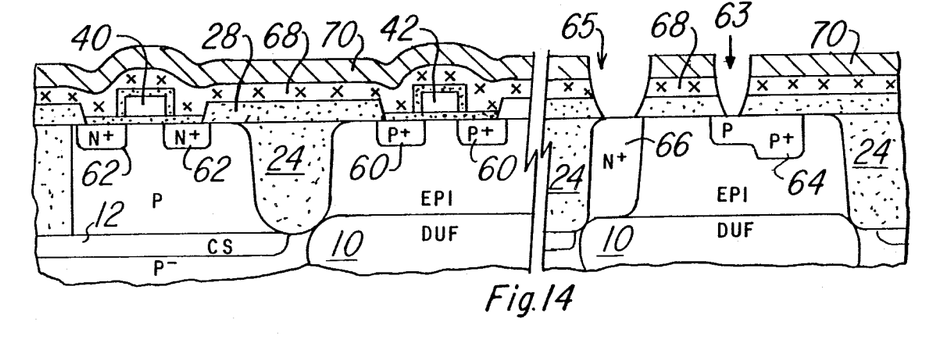
Figure 15:
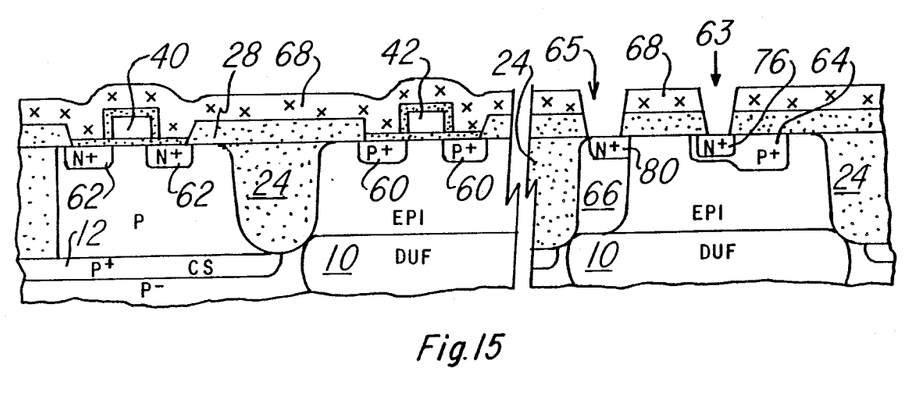

The purpose of the PSG 68 is to passivate the surface of oxide 28 so as to trap any alkali ions on the oxide surface that could otherwise cause leakage. It contains 4-8% by weight of phosphorus. A layer of photoresist 70 is then deposited and patterned to open the bipolar emitter 63 and collector 65 regions as seen in FIG. 14. The PSG is etched in the latter regions so as to expose contact areas on the latter. The layer 70 of photoresist is stripped and an N-type implant of arsenic is made at about 80 KeV and a dose of $4-8 \times 10^{15}$ atoms per square centimeter. A high temperature anneal is done in an inert atmosphere to activate the implant and form by diffusion the N+ type conductivity regions 76 and 80 seen in FIG. 15.

Alternatively, the PSG layer 68 could be deposited after the anneal and diffusion steps and then patterned and etched to open up contact areas to the transistor sources, drains, emitter base and collector.

Figure 16:
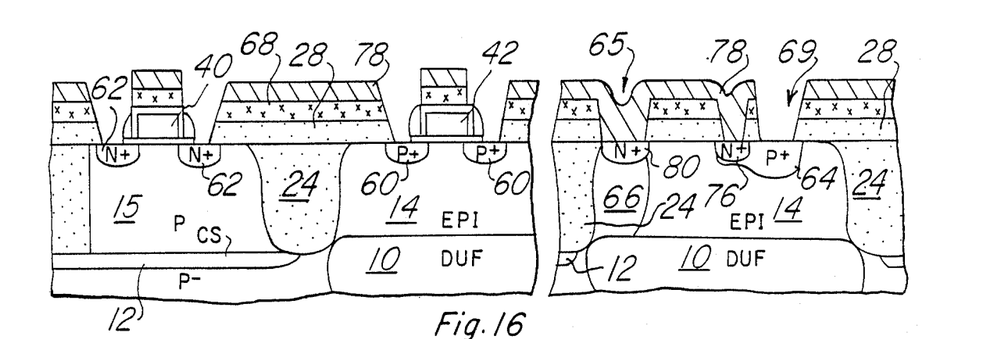
Figure 17:
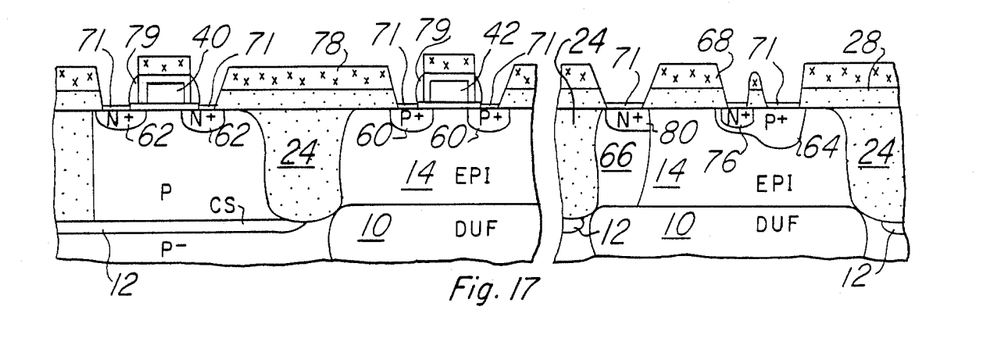
Figure 18:
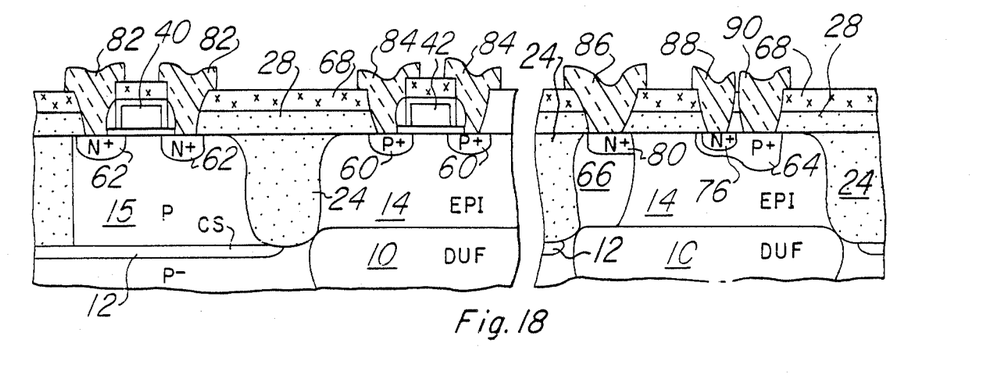

A new layer of photoresist is deposited and patterned to have openings over all of the sources and drains, over base region 69 and over contact regions 90 and 92 (see FIG. 19) to polysilicon gates 40 and 42. As seen in FIG. 16 the n contacts of openings 65 and 63 are kept covered while etching the p contact to protect the former. The PSG in the latter regions is etched and the photoresist 78 is stripped leaving all contact areas open. Next platinum is sputtered onto the slice and the slice heated to about 500° C. for about ½ to 1 hour in order to form platinum silicide 71 wherever silicon is in contact with platinum (at the bottom of each contact area). Next platinum on PSG 68 is stripped leaving the structure shown in FIG. 17. Finally, metal for interconnects is deposited, patterned and etched as shown in FIG. 18.

Interconnects either in a single or double layer are formed by standard techniques, followed by a passivating overcoat of a 7000 anstrom layer of oxide and a 3000 angstrom layer of silicon nitride.

Figure 19:
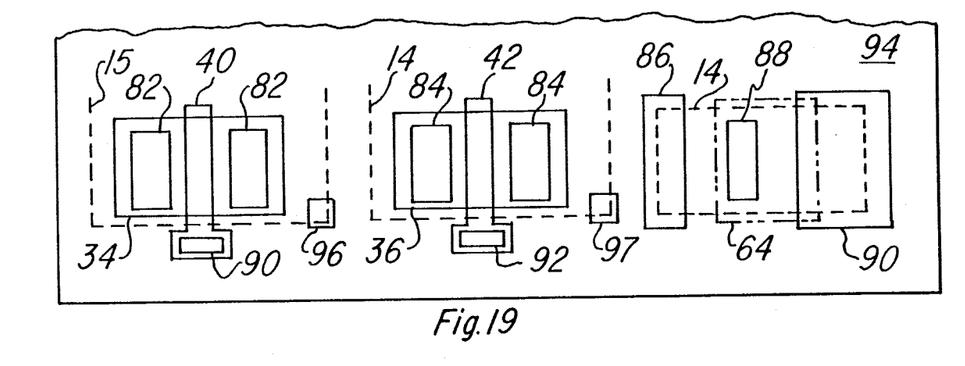
FIG. 19 is a plan view of a merged bipolar CMOS cell as seen in FIG. 18.

A top view of the various regions of the device formed on a slice 94 as shown in FIG. 19 includes moats 34 and 36 of the N-channel and P-channel transistors, respectively. The source/drain contacts 82 and 84 are formed on either side of polysilicon gates 40 and 42, respectively. Each MOS transistor is located within epitaxial regions 15 and 14. The bipolar portion includes collector contact 86, emitter contact 88, base contact 90 shown as covering a portion of the epitaxial region 14 next to base region 64 as to form a Schottky diode. Contacts to the N-type epitaxial layer in the P-channel transistor and to the P well of the N-channel is provided by contacts 97 and 96, respectively.

It will be observed that in the foregoing process definition of the moats is achieved by directly etching the silicon dioxide layer 28 and does not depend therefore on the accuracy of the positioning of oxide isolation regions 24. This procedure allows closer positioning of adjacent N-channel and P-channel transistors which need not be separated from each other by a deep oxide isolation region. A thin surface oxide is all that is necessary in the present case to isolate the latter transistors. This technique avoids problems associated with silicon-field oxide interfaces when an indirect process is used. Use of the channel stop 12 under the P-well and the buried collector or DUF 10 under the P-channel transistor acts to prevent latch-up.

Figure 20:
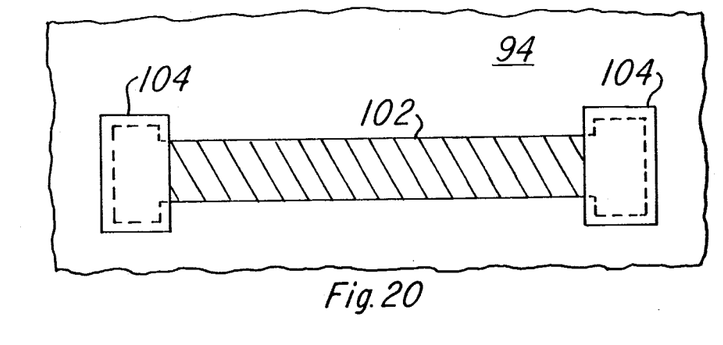
FIG. 20 is a top view showing a resistor.

Formation of resistors on the slice 94 as shown in FIG. 20 involves depositing and patterning photoresist (not shown) over a thin oxide coating covering an epitaxial layer 94 so as to open an area corresponding to resistor body 102. Boron is then implanted through the oxide into the epitaxial layer in an area 102 and 104 to obtain a sheet resistance in the range of 1,000 to 5,000 ohms per square. The photoresist is not stripped and new photoresist (not shown) is deposited and corresponding to the resistor ends and another boron implant is made so as to create P+ regions 104. The photoresist is removed and the thin oxide over areas 104 opened for contacts. Leads are deposited and patterned.

It will be readily appreciated that the Schottky diode shown in FIG. 19 can be formed adjacent the bipolar transistor by simply etching so as to extend contact 90 over the N-epitaxial layer as well as over region 64.

The use of a buried collector under the P-channel transistor avoids problems due to latch-up caused by leakage to the substrate.

By using a high energy implant to form the P-well rather than a long high temperature diffusion, problems associated with controlling gain and breakdown are avoided. In addition avoiding multiple anneal steps minimizes leaching of boron from the surface and therefore allows more accurate establishment of threshold voltage.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method of making a merged bipolar and field effect transistor on a semiconductor substrate of a first conductivity type, comprising:
   forming diffused buried DUF regions of a second conductivity type in said substrate;
   growing an epitaxial layer of said second conductivity type over said substrate;
   forming FET and bipolar dielectrically isolated isolation regions in said epitaxial layer; at least one FET isolation region being formed over one of said DUF regions;
   forming a gate within said FET isolation region;
   implanting a source and drain within said FET isolation region;
   implanting a base in said bipolar isolation region substantially concurrently with the implanting of said source and drain in said FET isolation region;
   protecting said gate from being implanted during said source, drain and base implants;
   implanting a collector in said bipolar isolation region;
   passivating the surface of the structure formed from the foregoing method steps, with a surface gettering material;
   heating said structure so as to cause said collector implant to merge with the surface of said epitaxial layer and with said DUF region, said heating also causing activation of said source, drain, and base implants;
   selectively etching away said gettering material; and
   implanting an emitter in said bipolar isolation region.

2. A method according to claim 1, wherein said source and drain implanting is done in a moat region in said FET isolation region, said source and drain comprising a first selected impurity of a conductivity type different than that of said moat;
   said base comprising a second selected impurity of said first conductivity type;
   said emitter comprising a third selected impurity of said second conductivity type; and
   said collector comprising a fourth selected impurity of said second conductivity type.

3. A method according to claim 1, wherein said isolation regions are formed by etching recessed regions into said epitaxial layer and then growing thick oxide regions in said recessed regions extending through said epitaxial layer.

4. A method of making merged bipolar and complementary field effect transistors on a semiconductor substrate of a first conductivity type, comprising:
   forming a first and second diffused buried DUF collector region of a second conductivity type in a face of said substrate;
   growing an epitaxial layer of the second conductivity type over said substrate;
   forming FET dielectrically isolated isolation regions and a bipolar dielectrically isolated isolation region in said epitaxial layer;
   forming a gate region in said FET isolation region;
   formng a bipolar transistor region including a base region over said first DUF region within said bipolar isolation region;
   forming complementary field effect transistor regions including drain/source regions within said field effect transistor isolation regions. wherein at least one of said complementary field effect transistors lies over said second DUF region, said drain/source regions being formed substantially concurrently with said base regions;

implanting a collector region in said bipolar transistor region; and heating the structure thus formed so as to merge said collector region with the surface of said epitaxial layer and with said first DUF region.

5. A method according to claim 4, wherein said transistor forming steps include:
   forming moat regions in said FET isolation regions;
   forming oxide insulated regions over respective moat regions;
   said drain/source regions being formed by an implantation in each of said moats of a conductivity type opposite to that of the respective moats;
   said base region being formed by an implantation in said bipolar isolation region of a conductivity type opposite to that of the underlying first DUF region;
   implanting an emitter within said base of a conductivity type opposite to that of the base;
   implanting a deep collector contact in said bipolar region; and
   heating said transistors to activate and diffuse the implants.

6. A method according to claim 4, wherein the edges of each of said source/drain regions of said field effect transistors are spaced away from associated adjacent isolation regions so as not to form an interface, therewith.

7. A method according to claim 4, wherein said implanting steps of said P-channel transistor are done concurrently with implanting steps of said bipolar transistors.

8. A method according to claim 5, wherein said isolation regions are formed by etching recessed regions into said epitaxial layer enclosing respective isolation regions and then growing thick oxide regions in said recessed regions extending through said epitaxial layer.

9. A method according to claim 5, including forming a channel stop region of a P-type conductivity in a face of said substrate below an N-channel one of said field effect transistors.

10. A method according to claim 5, wherein the source/drain implant of a P-channel one of said field effect transistors, and the base implant of said bipolar transistor base are boron, the implants of said buried collector and the source/drain regions of the N-channel field transistors are arsenic, and that of the collector contact region is phosphorous.

11. A method according to claim 5, wherein surface contact to said buried collector portion is made by a deep implant having a peak concentration approximately half way into said epitaxial layer and a shallow implant having a peak concentration of implant atoms at or near a surface of said epitaxial region and then diffusing and activating the implanted impurities and the underlying buried collector portion.

12. A method according to claim 5, including depositing a surface gettering layer over said semiconductor surface prior to said heating and diffusing and then patterning and etching the gettering layer so as to open up contact areas to the field transistor sources and drains, and the bipolar transistor emitter, base and collector.

13. A method according to claim 5, including depositing a surface gettering layer over the semiconductor surface after said heating and diffusing and then patterning and etching the gettering layer so as to open up contact areas to the field effect transistor sources, drains and emitter, base and collector so as to improve device fabrication control and performance.

14. A method according to claim 5, wherein said moat regions are formed by deposition, patterning and developing photoresist to open the moat areas and subsequent etching of underlying oxide to expose the moat areas so that the moat edges are spaced apart from the field oxide isolation regions.

15. A method according to claim 5, including opening transistor contacts to the sources, drains and gates of said field effect transistors and to the emitter, base and collector of the bipolar transistor and forming a layer of silicide over each of said transistor contacts prior to deposition of metal thereon.

16. A method according to claim 9, wherein a P-type well region is formed above the channel stop region.

17. A method according to claim 12, wherein said surface gettering layer is phospho-silicate glass.

18. A method according to claim 12, wherein said gettering layer is heated so that it reflows.

19. A method according to claim 16, wherein said P-type well implant is boron.

20. A method of making merged bipolar and field effect transistors on a semiconductor substrate of a first conductivity type comprising:
   forming a first and a second diffused buried DUF region of a second conductivity type in said substrate;
   forming a channel stop region in said substrate;
   growing a epitaxial layer of said second conductivity type over said substrate;
   forming first and second FET isolation regions and a bipolar isolation region in said epitaxial layer;
   forming gate regions within said FET isolation regions;
   implanting source and drain regions within said first FET isolation region while protecting said gate regions from the implant;
   implanting a base region in said bipolar isolation region substantially concurrently with the implanting of said source and drain regions in said first FET isolation region;
   implanting a collector region in said bipolar isolation region;
   implanting source and drain regions in the second FET isolation region while protecting said gate regions from the implant;
   passivating the surface of the structure, formed from the foregoing method steps, with a gettering material;
   heating said structure so as to cause said collector region to merge with the surface of said epitaxial layer and with said first DUF region, said heating also causing activation of said source, drain and base region implants;
   selectively etching away said gettering material; and
   implanting an emitter region in said bipolar isolation region.

21. A method of making merged bipolar and field effect transistors on a semiconductor substrate of a first conductivity type comprising:
   placing an oxide material over said substrate;
   placing a nitride material over said oxide material;
   forming a device isolation recess through said oxide and nitride materials and in said substrate;
   oxidizing the isolation recess so as to fill said recess with oxide;

planarizing said substrate so as to remove any resultant birdshead from the oxidizing of the isolation recess;

forming a first and a second diffused buried DUF region of a second conductivity type in said substrate;

forming a channel stop region of said first conductivity type in said substrate;

growing a silicon epitaxial layer of a second conductivity type over said substrate;

forming first and second FET isolation regions and a bipolar isolation region in said epitaxial layer;

forming gate oxide layers within said FET isolation regions;

forming gate regions over said gate oxide layers;

implanting source and drain regions within said first FET isolation region while protecting said gate regions from the implant;

implanting a base region in said bipolar isolation region concurrently with the implanting of said source and drain regions in said first FET isolation region;

implanting a collector region in said bipolar isolation region;

implanting source and drain regions in the second FET isolation region while protecting said gate regions from the implant;

passivating the surface of the structure formed from the foregoing method with a phosphosilicate glass;

heating said structure so as to cause said collector region to merge with the surface of said epitaxial layer and with said first DUF region, said heating also causing activation of said source, drain and base region implants;

selectively etching away said phosphosilicate glass;

and implanting an emitter region in said bipolar isolation region.

22. A method of making merged bipolar and field effect transistors at a surface of a semiconductor substrate of a first conductivity type, comprising:

forming a first and a second diffused buried region of a second conductivity type at predetermined locations of said surface;

forming an epitaxial layer of said second conductivity type over said surface;

forming isolation dielectric structures at selected locations of said surface to define in said epitaxial layer a second FET region over said first buried region, a bipolar region over said second buried region, and a first FET region;

doping said first FET region to form a well of said first conductivity type;

forming gate electrodes overlying said first and second FET regions;

forming source and drain regions of said first conductivity type within said second FET region and a base region in said bipolar region;

forming a collector contact in said bipolar region with said second conductivity type;

forming source and drain regions of said second conductivity type within said first FET region;

diffusing an emitter into said base region.

23. The method of claim 22, wherein said steps of forming the source and drain regions of said first and second FET regions, said base of said bipolar region, and said collector contact comprise:

implanting source and drain regions of said first conductivity type within said second FET region and a base region in said bipolar region;

implanting a collector contact in said bipolar region with said second conductivity type;

implanting source and drain regions of said second conductivity type within said first FET region;

heating said substrate so that said collector contact makes contact with said second buried region, and to diffuse said base, source and drain implants to predetermined depths.

24. The method as recited in claim 22 which further includes forming a channel stop region of said first conductivity type in a face of said substrate below said first FET region.

25. The method as recited in claim 23 which further includes the step of covering said gate electrodes during said source and drain implants.

26. The method as recited in claim 23 which further includes passivating the surface of the structure thus formed, before said collector contact heating step, with a surface gettering material and selectively etching away said gettering material after said collector contact heating step.

27. The method of claim 23 wherein said step of implanting said source and drain within second FET region and said base region comprises:

implanting said source and drain and said base region with said first conductivity type;

masking a portion of said base region; and implanting said source and drain and the unmasked portion of said base region with said first conductivity type.

28. The method as recited in claim 26 wherein said diffusing step comprising:

depositing doped polycrystalline material over said etched portion of said gettering material; and heating said substrate so that the dopant of said polycrystalline material diffuses into said base region to form an emitter.

* * * * *